(12) United States Patent
Gautham

(10) Patent No.: US 7,344,917 B2
(45) Date of Patent: Mar. 18, 2008

(54) METHOD FOR PACKAGING A SEMICONDUCTOR DEVICE

(75) Inventor: Viswanadam Gautham, Singapore (SG)

(73) Assignee: Freescale Semiconductor, Inc., Austin, TX (US)

( * ) Notice: Subject to any disclaimer, the term of this patent is extended or adjusted under 35 U.S.C. 154(b) by 71 days.

(21) Appl. No.: 11/290,300

(22) Filed: Nov. 30, 2005
(Under 37 CFR 1.47)

(65) Prior Publication Data
US 2007/0122940 A1 May 31, 2007

(51) Int. Cl.
*H01L 21/44* (2006.01)
*H01L 21/48* (2006.01)
*H01L 21/50* (2006.01)

(52) U.S. Cl. .................. 438/106; 438/108; 438/123
(58) Field of Classification Search ................ 438/108, 438/106, 123, 124, 126
See application file for complete search history.

(56) References Cited

U.S. PATENT DOCUMENTS

| | | | |
|---|---|---|---|
| 6,483,180 B1 | 11/2002 | Bayan et al. | |
| 6,689,638 B2 | 2/2004 | Lin et al. | |
| 6,759,268 B2 * | 7/2004 | Akagawa | 438/106 |
| 6,861,284 B2 * | 3/2005 | Higashi et al. | 438/107 |
| 7,078,269 B2 * | 7/2006 | Yamasaki et al. | 438/121 |
| 2003/0224542 A1 | 12/2003 | Liu | |
| 2004/0145039 A1 | 7/2004 | Shim et al. | |
| 2006/0255474 A1 * | 11/2006 | Ahmad et al. | 257/778 |

* cited by examiner

*Primary Examiner*—Chuong A. Luu
(74) *Attorney, Agent, or Firm*—Charles Bergere

(57) ABSTRACT

A method for packaging a semiconductor device includes forming through holes (12) in a base substrate (10) and depositing a conductive material (14) on a first side (16) of the base substrate (10) to form a conductive layer (18) such that the conductive material (14) fills the through holes (12). The conductive layer (18) is patterned and etched to form interconnect traces and pads (22). Conductive supports (24) are formed on the pads (22) such that the conductive supports (24) extend through respective ones of the through holes (12).

18 Claims, 2 Drawing Sheets

METHOD FOR PACKAGING A SEMICONDUCTOR DEVICE

BACKGROUND OF THE INVENTION

The present invention relates to packaging of semiconductor devices in general and more specifically to a method of forming a stacked package.

In tandem with the sophistication of electronic devices, there is a demand for greater functionality in smaller packages. Stacked die and stacked package three-dimensional (3D) packages have been developed to meet this demand. Typically, stacked die packages are formed by stacking multiple chips on one another. The chips in a stacked die package may be electrically coupled by wire bonding connections or flip chip connections. Stacked packages, on the other hand, are formed by stacking multiple packages on each other, where each package contains a single chip.

However, the formation of stacked die packages presents a number of problems. For instance, when stacked packages having wire bonding connections are formed, usually the upper chip is preferred to be smaller than the lower chip by an amount necessary for the area required to make the wire bonding connections. Accordingly, the mounting area for each successive upper chip is preferred to be progressively smaller, thereby imposing a limit on the number of packages that can be stacked.

Further, stacked packages are usually not processed in array (MAP) format; stacked packages are generally processed using glob top encapsulation or center gate molding and stacked only after singulation. For this reason, a longer manufacturing cycle time is required for the formation of stacked packages. Other problems associated with the formation of stacked packages include difficulty in ascertaining whether a die is functioning properly prior to stacking and larger overall package thickness for the same number of die stack.

In view of the foregoing, a need exists for a method of forming a reliable stacked package with increased functionality at low cost. Accordingly, it is an object of the present invention to provide a method of fabricating a reliable, low cost, high functionality stacked package.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures, in which like references indicate similar elements.

DETAILED DESCRIPTION OF THE PREFERRED EMBODIMENTS

Figure 1:
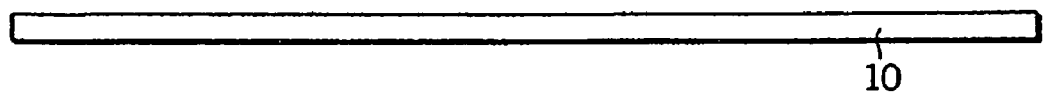
FIGS. 1 through 6 are enlarged cross-sectional views illustrating a method for forming a plurality of stackable semiconductor devices in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

To achieve the objects and advantages discussed above and others, the present invention provides a method for packaging a semiconductor device. The method includes the steps of forming a plurality of through holes in a base substrate and depositing a conductive material on a first side of the base substrate to form a conductive layer. The conductive material fills the plurality of through holes. The conductive layer is patterned and etched to form a plurality of interconnect traces and a plurality of pads. A plurality of conductive supports is formed on the plurality of pads. The conductive supports extend through respective ones of the plurality of through holes.

The present invention also provides a method for packaging a semiconductor device, including the steps of forming a plurality of through holes in a base substrate, depositing a conductive material on a first side of the base substrate to form a conductive layer, and patterning and etching the conductive layer to form a plurality of interconnect traces and a plurality of pads. The conductive material at least partially fills the plurality of through holes. A plurality of conductive supports is formed on the pads. The conductive supports are substantially parallel with each other, substantially perpendicular to the base substrate, and extend through respective ones of the plurality of through holes. At least one semiconductor die is electrically coupled to the interconnect traces and pads.

The present invention further provides a method for packaging a semiconductor device, comprising the steps of forming a plurality of through holes in a base substrate, depositing a conductive material on a first side of the base substrate to form a conductive layer, wherein the conductive material fills the through holes, and patterning and etching the conductive layer to form a plurality of interconnect traces and a plurality of pads. A plurality of substantially parallel conductive supports is formed on the plurality of pads. The conductive supports are substantially perpendicular to the base substrate and extend through respective ones of the plurality of through holes. An electroless finish is applied to the interconnect traces, pads and conductive supports. A plurality of die is electrically coupled to the interconnect traces and pads and a moulding operation is performed to encapsulate the die, wherein at least one end of each conductive support is exposed. In this manner a first stackable assembly is formed. A second stackable assembly substantially similar to the first stackable assembly is formed. A stacked assembly is formed by stacking the second stackable assembly on the first stackable assembly. The first and second stackable assemblies are electrically coupled one to the other by the conductive supports. The stacked assembly then is cut or singulated into a plurality of stacked packages.

FIGS. 1-8 illustrate a method for packaging a semiconductor device in accordance with an embodiment of the present invention. Referring now to FIG. 1, a base substrate 10 having a thickness of at least about 1.0 mil is shown. Although the thickness of the base substrate 10 is specified in this particular example, it should be understood that the present invention is not limited by the thickness of the base substrate 10. The base substrate 10 may be made of a Polyimide (PI) tape or some other non-electrically conductive material, as is known by those of skill in the art.

Figure 2:
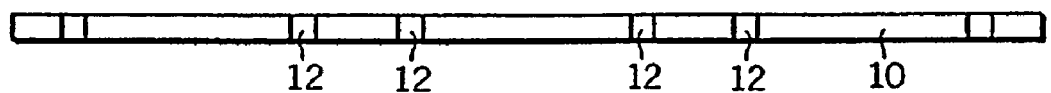

Referring now to FIG. 2, a plurality of through holes 12 are formed in the base substrate 10 as shown. The through holes 12 may be formed by drilling or some other appropriate method known to those of skill in the art. The size of the through holes 12 ranges from about 200 um to about 600 um, and the through holes 12 are located or positioned at the periphery of each substrate 10.

Figure 3:
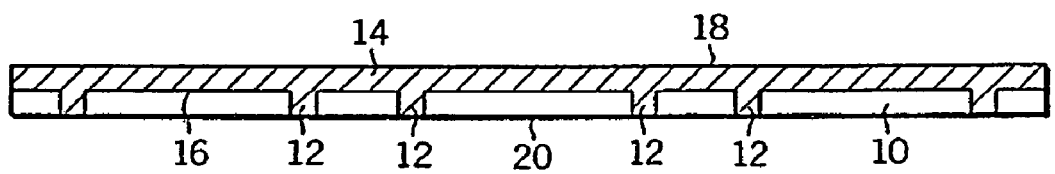

FIG. 3 shows a conductive material 14 such as, for example, copper deposited on a first side 16 of the base substrate 10 to form a conductive layer 18. As can be seen, the through holes 12 are filled with the conductive material 14. A second side 20 of the base substrate 10 preferably is shielded during the deposition of the conductive material 14. In this particular example, the conductive layer 18 is about 5 microns (μm) thick. However, it should be understood that the present invention is not limited by the thickness of the conductive layer 18.

Figure 4:
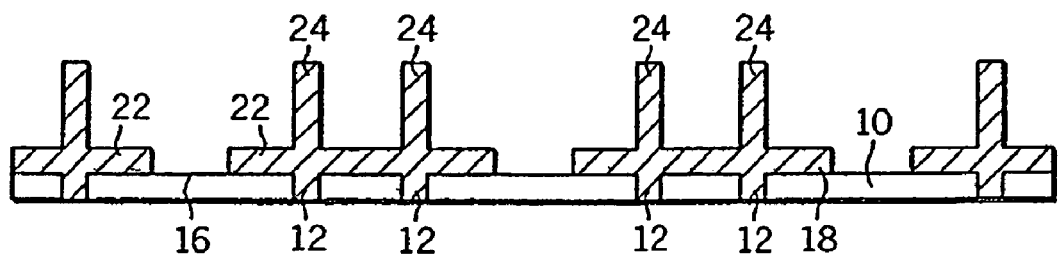

Referring now to FIG. 4, the conductive layer 18 is patterned and etched to form a plurality of interconnect traces and a plurality of pads 22. A plurality of conductive supports 24, each extending through respective ones of the through holes 12, are formed on the pads 22 as shown. The conductive supports 24 are substantially parallel with each other and substantially perpendicular to the base substrate 10.

The conductive supports 24 are formed of an electrically conductive material such as, for example, copper, and may be formed by an additive process, such as, for example, electroplating. In this particular example, each conductive support 24 has a width of about 200 μm. However, it should be understood that the present invention is not limited by the width of the conductive supports 24, or the type of material or the method used for the formation of the conductive supports 24.

The interconnect traces and pads 22 are patterned and etched using standard lithographic techniques known in the art such as, for example, photo etching. The interconnect traces are masked using a resist mask prior to formation of the conductive supports 24 on the pads 22. Such resist masks are known in the art. The resist mask is removed from the interconnect traces thereafter.

In one embodiment, an electroless finish is applied to the interconnect traces, the pads 22 and the conductive supports 24 to prevent oxidation. Nickel, gold or a nickel-gold alloy may be used for the electroless finish. However, it should be understood that the present invention is not limited by the type of metal or metal alloy used for the electroless finish.

Figure 5:
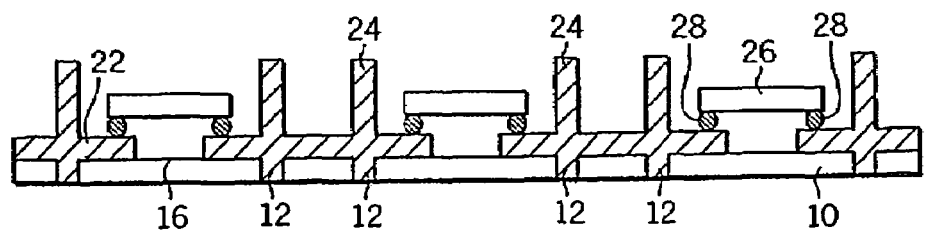

FIG. 5 shows at least one die 26 electrically coupled to the base substrate 10. The die 26 may be a processor, such as a digital signal processor (DSP), a special function circuit, such as a memory address generator, or perform any other type of function. Moreover, the die 26 is not limited to a particularly technology such as CMOS, or derived from any particular wafer technology. Further, the present invention can accommodate various die sizes, as will be understood by those of skill in the art. A typical example is a logic die having a size of about 7 mm by 7 mm. Although FIG. 5 shows only three (3) dies, it will be understood that more or fewer dies may be attached to a substrate, depending on the size of the substrate, the size of the dies, and the required functionality of the resulting devices. In this particular example, the dies 26 are coupled to the substrate bonding pads 22 via a plurality of flip chip bumps 28. Nevertheless, it should be understood that the present invention is not limited to flip chip applications. In alternative embodiments, the die 26 may, for example, be electrically coupled to the substrate bonding pads 22 via wire bonds (see FIG. 7).

The purpose of the conductive supports 24 is to allow for electrical connection between stacked packages. As can be seen from FIG. 5, a height of each conductive support 24 is related to a height of the die 26 and the height of the final packages. The conductive supports 24 must have a height that is equal to at least the height of the die 26 plus the height of the flip chip bumps 28 if the die is coupled to the pads 22 with bumps 28, plus the height of the substrate 10. Although FIG. 5 shows the conductive supports 24 extending beyond a top of the die 26, the conductive supports 24 could be flush with the top of the die 26. If the die 26 is coupled to the pads 22 with wires (see wires 27 in FIG. 7, described below), then the height of the conductive supports should extend beyond the top of the die 26 by a bit more than the height of the wire loops. In one example embodiment, the conductive supports 24 have a height of at least about 400 μm for a die 26 having a height of about 200 μm and flip chip bumps 28 having a height of about 100 μm.

Figure 6:
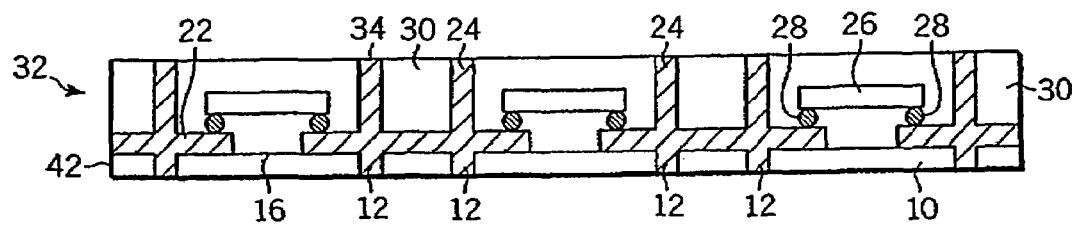

Referring now to FIG. 6, the die 26 are encapsulated with an encapsulant material 30 to form a first stackable assembly 32 as shown. A moulding operation such as, for example, over moulding is performed to encapsulate the die 26, preferably leaving both ends 34 of each conductive support 24 exposed. The encapsulant material 30 may comprise well known commercially available moulding materials such as plastic or epoxy. Over moulding eliminates the need for an under fill process, thereby reducing processing cost. Elimination of under fill also increases package level qualifications to Moisture Sensitivity Level 1 (MSL1) at 260° C.

Figure 7:
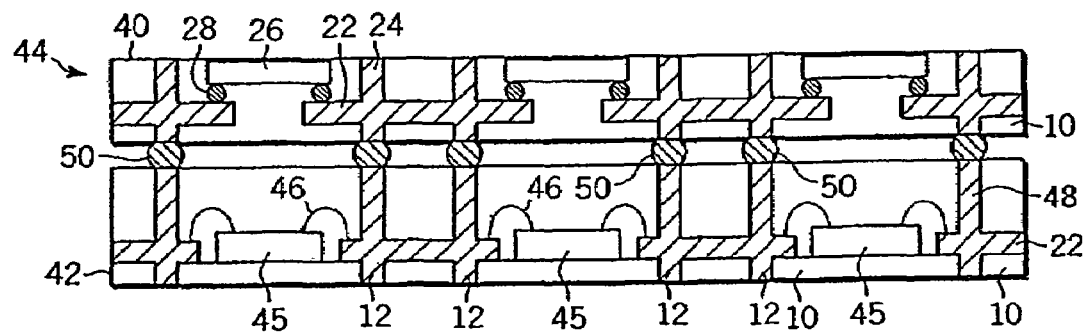
FIG. 7 is an enlarged cross-sectional view illustrating a method for stacking a plurality of semiconductor devices in accordance with an embodiment of the present invention.

Referring now to FIG. 7, a first stackable assembly 40 is stacked on and electrically coupled to a second stackable assembly 42 to form a stacked assembly 44. In order to illustrate the various embodiments of a stackable assembly of the present invention, the first stackable assembly 40 has dies 26 attached to pads 22 with flip chip bumps 28 and the conductive supports 24 have top ends that are flush with top surfaces of the dies 26. The second stackable assembly 42 had dies 45 that are attached to the substrate 10 and electrically coupled to the pads 22 via wires 46, and conductive supports 48 that extend beyond a top surface of the dies 45. It will be understood by those of skill in the art that the stackable assemblies 40 and 42 could be formed using the same process (e.g., both with flip chip attached die) and have the same dimensions.

In this particular example, the first and second stackable assemblies 40 and 42 are aligned such that the conductive supports 24 of the first stackable assembly 40 are aligned with the conductive supports 48 of the second stackable assembly 42, and the conductive supports 24 and 48 and thus the first and second stackable assemblies 40 and 42 are electrically connected with solder balls 50. The solder balls 50 may be secured to the first and second stackable assemblies 40 and 42 using known solder ball attach processes. Nonetheless, it should be understood that the present invention is not limited to such a stacking method. Other methods of stacking such as, for example, paste print and reflow; anisotropic conductive film and polymer conductor paste may be employed as well. In alternative embodiments, a second conductive layer made of an electrically conductive material such as copper may be deposited over selective portions of the stacked assembly 44 and discrete passive devices may be attached to the second conductive layer.

Although only two stackable assemblies 40 and 42 are illustrated in this embodiment, it should be understood that multiple stackable assemblies in array (MAP) format may be assembled one atop another in accordance with the present invention.

Figure 8:
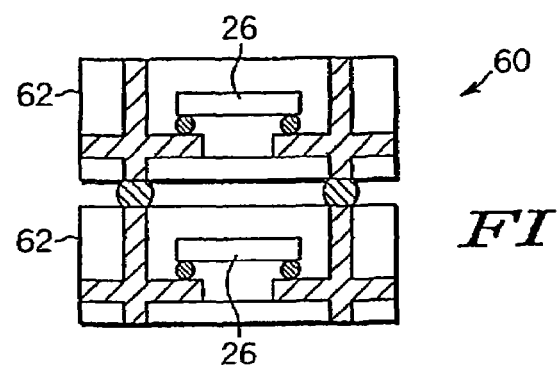
FIG. 8 is an enlarged cross-sectional view of a stacked semiconductor device in accordance with an embodiment of the present invention.

FIG. 8 shows a stacked assembly 60 formed from two stackable packages 62. The stackable packages 62 were formed using as part of an array of stackable packages, stacked, and then the stacked arrays were singulated or diced to form the stacked assembly 60. The stacked assembly 60 may be attached directly onto a board substrate such as in Surface Mount Technology (SMT). Because each stacked assembly 60 includes a plurality of die 26, increased functionality is achieved within a single die foot print area.

The present invention also provides a stackable assembly, comprising a base substrate having a plurality of through holes formed therein; a conductive material formed on at least a first side of the base substrate to form a conductive layer, wherein the conductive material at least partially fills the plurality of through holes and is patterned and etched layer to form a plurality of interconnect traces and a plurality of pads; and a plurality of conductive supports formed on the plurality of pads, wherein the plurality of conductive supports extends through respective ones of the plurality of through holes. The stackable assembly may further include a semiconductor integrated circuit (IC) attached to the pads, such as via flip chip bumps, wire bonding or direct chip attach, and an encapsulant covering the IC and pads, while preferably leaving exposed the ends of the conductive supports. Then, additional stackable assemblies can be stacked, one atop another, wherein the stackable assemblies are electrically coupled by way of the conductive supports.

As is evident from the foregoing discussion, the present invention provides a method for packaging a semiconductor device, which has benefits over existing processes. As an example, packaging of semiconductor devices in accordance with the present invention can be done in MAP format, thereby achieving high throughput. In addition, known good die can be used for packaging of semiconductor devices in accordance with the present invention as the die can be tested after bumping and prior to encapsulation. Also, final testing of each package can be conducted without damaging the die by probing the exposed ends of the conductive supports directly. Moreover, there is no limit to the number of packages that can be stacked since there is no requirement in the present invention for the upper package to be smaller than the lower package. Further, thin stackable assemblies may be made with the present invention.

Low manufacturing cost is achievable with the present invention since only a single layer base substrate is used, an under fill is not required and existing equipment and processes can be used to implement the present invention. The present invention also achieves high functionality as the interconnect traces are laid on the base substrate, allowing multiple functional silicon die in the stack. Other advantages achievable with the present invention include high density Input and Output (IO) stacking as fine line routing on the base substrates extend to vary high density packages, increased reliability due to elimination of silicon to printed circuit board (PCB) thermal mismatch and flexibility in the types of solder and base substrates used.

Thus it is apparent that there has been provided, in accordance with the invention, a method for packaging a semiconductor device that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the conductive layers and conductive supports are not limited to copper, but may be made of any conductive material used in the art. As addressed earlier, the present invention is not limited by the dimensions of the base substrate, the conductive layer, the conductive supports, or the die size. Nor is the device configuration limited to flip chip and wire bond applications. It should be understood that the present invention may be applied to System In Package (SIP) technologies. Furthermore, the present invention is not limited to those types of semiconductor die described or illustrated herein. Therefore, it is intended that this invention encompass all such variations and modifications as fall within the scope of the appended claims.

The invention claimed is:

1. A method for packaging a stackable semiconductor device, comprising the steps of:
   forming a plurality of through holes in a base substrate;
   depositing a conductive material on at least a first side of the base substrate to form a conductive layer, wherein the conductive material at least partially fills the plurality of through holes;
   patterning and etching the conductive layer to form a plurality of interconnect traces and a plurality of pads;
   forming a plurality of conductive supports on the plurality of pads, wherein the plurality of conductive supports extends in a first, downward direction through respective ones of the plurality of through holes and in a second, upward direction above the through holes to a predetermined height that is much greater than a height of the conductive layer;
   electrically coupling at least one die to the plurality of pads, wherein the conductive supports extend both above and below the die; and
   performing a moulding operation to encapsulate the die, wherein at least one end of each conductive support is exposed.

2. The method for packaging a stackable semiconductor device of claim 1, further comprising shielding a second side of the base substrate from the conductive material.

3. The method for packaging a stackable semiconductor device of claim 1, wherein the base substrate comprises a polyimide tape.

4. The method for packaging a stackable semiconductor device of claim 1, wherein the conductive material is copper.

5. The method for packaging a stackable semiconductor device of claim 4, wherein the plurality of conductive supports is made of copper.

6. The method for packaging a stackable semiconductor device of claim 1, further comprising applying an electroless finish to the plurality of interconnect traces, the plurality of pads and the plurality of conductive supports.

7. The method for packaging a stackable semiconductor device of claim 6, wherein the electroless finish comprises one of nickel, gold and a nickel-gold alloy.

8. The method for packaging a stackable semiconductor device of claim 1, wherein each conductive support has a width of about 200 microns.

9. The method for packaging a stackable semiconductor device of claim S, wherein the plurality of conductive supports are substantially parallel to each other.

10. the method for packaging a stackable semiconductor device of claim 9, wherein the plurality of conductive supports are substantially perpendicular to the base substrate.

11. The method for packaging a stackable semiconductor device of claim 1, wherein the die is electrically coupled to the substrate bonding pads via wire bonds.

12. The method for packaging a stackable semiconductor device of claim 1, wherein the die is electrically coupled to the substrate bonding pads via flip chip bumps.

13. The method for packaging a stackable semiconductor device of claim 1, wherein a plurality of die is electrically coupled to the interconnect traces and pads and encapsulated thereon, thereby forming a first stackable assembly, the method further comprising:

stacking a second stackable assembly on the first stackable assembly, wherein the first and second stackable assemblies are electrically coupled one to the other to form a stacked assembly; and singulating the stacked assembly into a plurality of stacked packages.

14. The method for packaging a stackable semiconductor device of claim 13, further comprising depositing a second conductive layer over the stacked assembly, and attaching a discrete passive device on the second conductive layer.

15. The method for packaging a stackable semiconductor device of claim 13, wherein the plurality of stackable assemblies are stacked using one of solder ball attach, paste print and reflow, anisotropic conductive film and polymer conductor paste.

16. A method for packaging a semiconductor device, comprising the steps of:

forming a plurality of through holes in a base substrate;

depositing a conductive material on at least a first side of the base substrate to form a conductive layer, wherein the conductive material at least partially fills the plurality of through holes;

patterning and etching the conductive layer to form a plurality of interconnect traces and a plurality of pads;

forming a plurality of substantially parallel conductive supports on the plurality of pads, wherein the plurality of conductive supports are substantially perpendicular to the base substrate and extend in a first, downward direction through respective ones of the plurality of through holes and in a second, upward direction above the through holes to a predetermined height that is much greater than a height of the conductive layer;

electrically coupling at least one die to the interconnect traces and pads, wherein the conductive supports extend both above and below the die; and encapsulating the plurality of die and the conductive supports, wherein at least one end of the conductive supports are exposed, thereby forming a first stackable assembly.

17. The method for packaging a stackable semiconductor device of claim 16, wherein a plurality of die is electrically coupled to the interconnect traces and pads, the method further comprising:

forming a second stackable assembly substantially similar to the first stackable assembly;

forming a stacked assembly by stacking the second stackable assembly on the first stackable assembly, wherein the first and second stackable assemblies are electrically coupled one to the other by way of the conductive supports; and singulating the stacked assembly into a plurality of stacked packages.

18. A method for packaging a semiconductor device, comprising the steps of:

forming a plurality of through holes in a base substrate, wherein the base substrate comprises a polyimide tape;

depositing a conductive material on at least a first side of the base substrate to form a conductive layer, wherein the conductive material at least partially fills the plurality of through holes;

patterning and etching the conductive layer to form a plurality of interconnect traces and a plurality of pads;

forming a plurality of substantially parallel conductive supports on the plurality of pads, wherein the plurality of conductive supports are substantially perpendicular to the base substrate and extend in a first, downward direction through respective ones of the plurality of through holes and in a second, upward direction above the through holes to a predetermined height that is much greater than a height of the conductive layer; and applying an electroless finish to the plurality of interconnect traces, the plurality of pads and the plurality of conductive supports;

electrically coupling a plurality of die to the interconnect traces and pads, wherein the conductive supports extend both above and below the plurality of die;

performing a moulding operation to encapsulate the plurality of die, wherein at least one end of each conductive support is exposed, thereby forming a first stackable assembly;

forming a second stackable assembly substantially similar to the first stackable assembly;

forming a stacked assembly by stacking the second stackable assembly on the first stackable assembly, wherein the first and second stackable assemblies are electrically coupled one to the other by way of the conductive supports; and singulating the stacked assembly into a plurality of stacked packages.

* * * * *

UNITED STATES PATENT AND TRADEMARK OFFICE
CERTIFICATE OF CORRECTION

PATENT NO. : 7,344,917 B2  Page 1 of 1
APPLICATION NO. : 11/290300
DATED : March 18, 2008
INVENTOR(S) : Viswanadam Gautham It is certified that error appears in the above-identified patent and that said Letters Patent is hereby corrected as shown below:

Column 6, Line 62, Claim No. 9:

Change "S" to --8--

Signed and Sealed this

Fifteenth Day of July, 2008

JON W. DUDAS
*Director of the United States Patent and Trademark Office*